United States Patent
Yoshida et al.

(10) Patent No.: US 11,265,026 B2
(45) Date of Patent: Mar. 1, 2022

(54) TUNER DEVICE

(71) Applicant: Sony Semiconductor Solutions Corporation, Kanagawa (JP)

(72) Inventors: Toshikazu Yoshida, Kanagawa (JP); Takahiro Ando, Kanagawa (JP); Norihiro Murayama, Chiba (JP); Hiroshige Takakuwa, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 33 days.

(21) Appl. No.: 16/757,616

(22) PCT Filed: Aug. 22, 2018

(86) PCT No.: PCT/JP2018/030927
§ 371 (c)(1),
(2) Date: Apr. 20, 2020

(87) PCT Pub. No.: WO2019/082485
PCT Pub. Date: May 2, 2019

(65) Prior Publication Data
US 2020/0328765 A1    Oct. 15, 2020

(30) Foreign Application Priority Data
Oct. 27, 2017   (JP) .............. JP2017-208218

(51) Int. Cl.
| | |
|---|---|
| *H04B 1/10* | (2006.01) |
| *H04H 20/44* | (2008.01) |
| *H04H 40/18* | (2008.01) |
| *H04B 1/00* | (2006.01) |
| *H04B 1/16* | (2006.01) |

(Continued)

(52) U.S. Cl.
CPC .............. *H04B 1/0071* (2013.01); *H03J 7/02* (2013.01); *H03L 7/0814* (2013.01);
(Continued)

(58) Field of Classification Search
CPC .... H04B 1/005; H04B 1/0057; H04B 1/0071; H04B 1/0067; H04B 1/10; H04B 1/16;
(Continued)

(56) References Cited

U.S. PATENT DOCUMENTS

| | | | |
|---|---|---|---|
| 2006/0099906 A1 | 5/2006 | Bae | |
| 2007/0082603 A1* | 4/2007 | Norin | H04N 7/20 455/3.02 |

(Continued)

FOREIGN PATENT DOCUMENTS

| | | |
|---|---|---|
| CN | 1713534 A | 12/2005 |
| CN | 1822674 A | 8/2006 |

(Continued)

OTHER PUBLICATIONS

International Search Report issued in International Patent Application No. PCT/JP2018/030927 dated Nov. 20, 2018, and English translation of same. 9 pages.

(Continued)

*Primary Examiner* — Blane J Jackson
(74) *Attorney, Agent, or Firm* — K&L Gates LLP

(57) ABSTRACT

Disclosed is a tuner device including an input terminal, a separator, a first amplifier, a second amplifier, and a tuner. The input terminal receives an input of a reception signal of satellite digital broadcasts. The separator is connected to the input terminal and adapted to frequency-separate a first signal and a second signal. The first signal is in a low-frequency domain of the reception signal, and the second signal is in a high-frequency domain of the reception signal. The first and second amplifiers respectively amplify the first and second signals. The tuner receives an input of output signals from the first and second amplifiers.

9 Claims, 13 Drawing Sheets

(51) Int. Cl.
   *H04H 20/51*   (2008.01)
   *H04H 40/90*   (2008.01)
   *H04N 21/434*  (2011.01)
   *H04N 21/438*  (2011.01)
   *H04N 21/61*   (2011.01)
   *H03J 7/02*    (2006.01)
   *H03L 7/099*   (2006.01)
   *H03L 7/081*   (2006.01)

(52) U.S. Cl.
   CPC .......... *H03L 7/0818* (2013.01); *H03L 7/0996* (2013.01); *H04B 1/10* (2013.01); *H04B 1/16* (2013.01); *H04H 20/51* (2013.01); *H04H 40/90* (2013.01); *H04N 21/434* (2013.01); *H04N 21/4383* (2013.01); *H04N 21/6112* (2013.01); *H04N 21/6143* (2013.01)

(58) Field of Classification Search
   CPC .......... H03J 7/02; H03J 7/0814; H03J 7/0818; H03J 7/0996; H04H 20/51; H04H 40/90; H04H 21/434; H04H 21/4383; H04H 21/6112; H04H 21/6143; H03L 7/0814; H03L 7/0818; H03L 7/0996
   See application file for complete search history.

(56) References Cited

U.S. PATENT DOCUMENTS

| | | | |
|---|---|---|---|
| 2007/0238436 A1* | 10/2007 | Motoyama | H04B 1/28 455/313 |
| 2011/0281543 A1* | 11/2011 | White | H04L 12/2861 455/337 |
| 2016/0127773 A1 | 5/2016 | Kang | |

FOREIGN PATENT DOCUMENTS

| | | |
|---|---|---|
| JP | 2007-116358 | 5/2007 |
| JP | 2009-105648 | 5/2009 |
| JP | 2009-118056 | 5/2009 |
| JP | 2012-156690 | 8/2012 |
| JP | 2016-046790 | 4/2016 |
| JP | 2017-510101 | 4/2017 |
| WO | WO2004080067 A1 | 9/2004 |

OTHER PUBLICATIONS

Written Opinion issued in International Patent Application No. PCT/JP2018/030927 dated Nov. 20, 2018. 6 pages.

* cited by examiner

TUNER DEVICE

TECHNICAL FIELD

The present technology relates to a tuner device that is used to receive advanced broadband satellite digital broadcasts.

BACKGROUND ART

In present satellite digital television broadcasting, a television signal is transmitted at an intermediate frequency between approximately 1 GHz and 2.1 GHz (an intermediate frequency is referred to as an IF (Intermediate Frequency) as appropriate and used as a term representing both an intermediate frequency and an intermediate frequency signal). However, in advanced broadband satellite digital broadcasting (referred to as advanced BS broadcasting as appropriate), which is scheduled to begin in 2018 as practical broadcasting, the IF is extended to the range of approximately 2.1 GHz to 3.2 GHz in order to provide 4K/8K ultra-high-definition television broadcasting.

In general, an increase in frequency reduces the signal intensity of a high-frequency signal depending, for example, on reception equipment, and thus makes a difference in signal intensity between a low-frequency signal and a high-frequency signal. This problem is called a tilt problem. Further, in the past satellite signal reception band, a twofold distortion (or a secondary distortion), which is a main component of signal distortion, was almost unlikely to occur. However, when the IF is extended to 3.2 GHz, the twofold distortion caused by an IF in the past is extended to interfere with an IF band.

Also in the beginning of satellite digital television broadcasting, the tilt problem occurred. Therefore, the tilt problem was addressed by improving distortion characteristics or placing a PIN attenuator before a satellite input separated by a high-pass filter as described in PTL 1. The PIN attenuator is a high-frequency attenuator that uses a PIN diode.

CITATION LIST

Patent Literature

[PTL 1]
Japanese Patent Laid-open No. 2007-116358

SUMMARY

Technical Problem

As described above, as regards frequency extension in advanced BS broadcasting, using the PIN attenuator described in PTL 1 is not adequate to address the tilt problem due to an increase in distortion components such as a twofold distortion and an increase in signal intensity difference.

Accordingly, an object of the present technology is to provide a tuner device capable of preventing an increase in distortion components.

Solution to Problem

According to a first aspect of the present technology, there is provided a tuner device including an input terminal, a separator, a first amplifier, a second amplifier, and a tuner. The input terminal receives an input of a reception signal of satellite digital broadcasts. The separator is connected to the input terminal and adapted to frequency-separate a first signal and a second signal. The first signal is in a low-frequency domain of the reception signal. The second signal is in a high-frequency domain of the reception signal. The first and second amplifiers respectively amplify the first and second signals. The tuner receives an input of output signals from the first and second amplifiers.

According to a second aspect of the present technology, there is provided a tuner device including an input terminal, a separator, a first amplifier, a second amplifier, a multiplexer, a tuner, and an output terminal. The input terminal receives an input of a reception signal of satellite digital broadcasts. The separator is connected to the input terminal and adapted to frequency-separate a first signal and a second signal. The first signal is in a low-frequency domain of the reception signal. The second signal is in a high-frequency domain of the reception signal. The first and second amplifiers respectively amplify the first and second signals. The multiplexer frequency-separates a fifth signal from an output of the first amplifier, frequency-separates a sixth signal from an output of the second amplifier, and frequency-multiplexes the separated fifth and sixth signals. The fifth signal is in a low-frequency domain of the output of the first amplifier. The sixth signal is in a high-frequency domain of the output of the second amplifier. The tuner receives an input of an output signal from the multiplexer. The output terminal is connected to the multiplexer.

According to a third aspect of the present technology, there is provided a tuner device including a tuner case, four connectors, and a shield section. The tuner case is metallic and has a substantially rectangular main surface and peripheral members disposed along the periphery of the main surface. The four connectors are attached to respective areas near four corners of the main surface of the outside of the tuner case. The shield section is separated from the tuner case and disposed in each area near the four corners inside the tuner case.

Advantageous Effect of Invention

According to at least one embodiment, the signal supplied to the tuner can be less distorted. It should be noted that advantageous effect described here are not necessarily limited, and may be any advantageous effect described in this document or advantageous effect different from those described in this document. Further, the contents of the present technology are not to be interpreted as being limited by the advantageous effect illustrated in the following description.

DESCRIPTION OF EMBODIMENTS

Embodiments described below are preferred specific examples of the present technology, and subject to various preferred technical limitations. However, the scope of the present technology is not limited to these embodiments unless specifically stated in the following description to the effect that the present technology is limited.

The present technology will be described in the following order.

<1. Problems with Advanced BS Broadcasting>
<2. First Embodiment of Present Technology>
<3. Second Embodiment of Present Technology>
<4. Third Embodiment of Present Technology>
<5. Fourth Embodiment of Present Technology>
<6. Example of Tuner Configuration>
<7. Modification Examples>

1. Problems with Advanced BS Broadcasting

Figure 13:
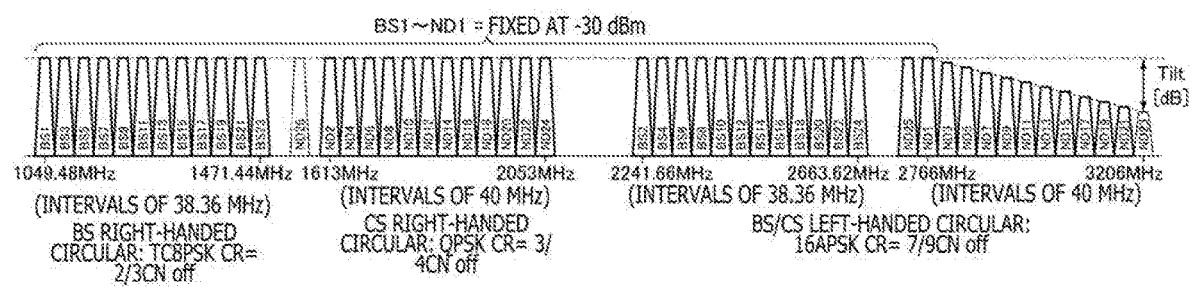
FIG. 13 includes a diagram illustrating a signal environment used to verify advantageous effect provided by the present technology and a table illustrating the result of the verification.

Problems with advanced BS broadcasting will now be described with reference to FIGS. 13 and 14. FIG. 13 illustrates the frequency of an IF in advanced BS broadcasting. For example, the center frequency of an IF of channel No. BS-1 is 1049.48 MHz. Channels BS-3, BS-5, BS-7, and so on to BS-23 are sequentially disposed. The center frequency of an IF of channel No. BS-23 is 1471.44 MHz. A CS-IF is disposed in a frequency band higher than the IF of this BS. For example, the center frequency of an IF of channel No. ND-2 is 1613 MHz, and channels ND-2, ND-4, ND-6, and so on to ND-24 are sequentially disposed. For example, the center frequency of an IF of channel No. ND-24 is 2053 MHz. The IFs of channels BS-1 to BS-23 and ND-2 to ND-24 are existing BS and CS broadcast channels, and radio waves are right-handed circularly polarized waves.

In advanced BS broadcasting, left-handed circular polarized waves are used. That is, channels No. BS-2, BS-4, and so on to BS24 and channels No. ND-1, ND-3, ND-5, and so on to ND-23 are channels for the left-handed circular polarized waves. For example, the center frequency of channel No. BS-2 is 2241.66 MHz, and the center frequency of channel No. BS-24 is 2663.62 MHz. Further, the center frequency of channel No. ND-1 is 2766 MHz, and the center frequency of channel No. ND-23 is 3206 MHz.

FIG. 13 illustrates a signal waveform at the time of testing of signal intensity difference tolerance regarding the present technology. Testing was conducted by providing a constant signal level (e.g., −30 dB) for channels in a band lower than the existing frequency domain and the newly added frequency domain, gradually lowering the signal level from an upper channel of the newly added frequency domain, and confirming the lowest signal level at which the highest-frequency channel ND-23 is able to achieve reception. As a result, tolerance up to a tilt level of 20 dB, which is expected in a market environment, was secured. This made it possible to confirm the effectiveness of the present technology.

Figure 14:
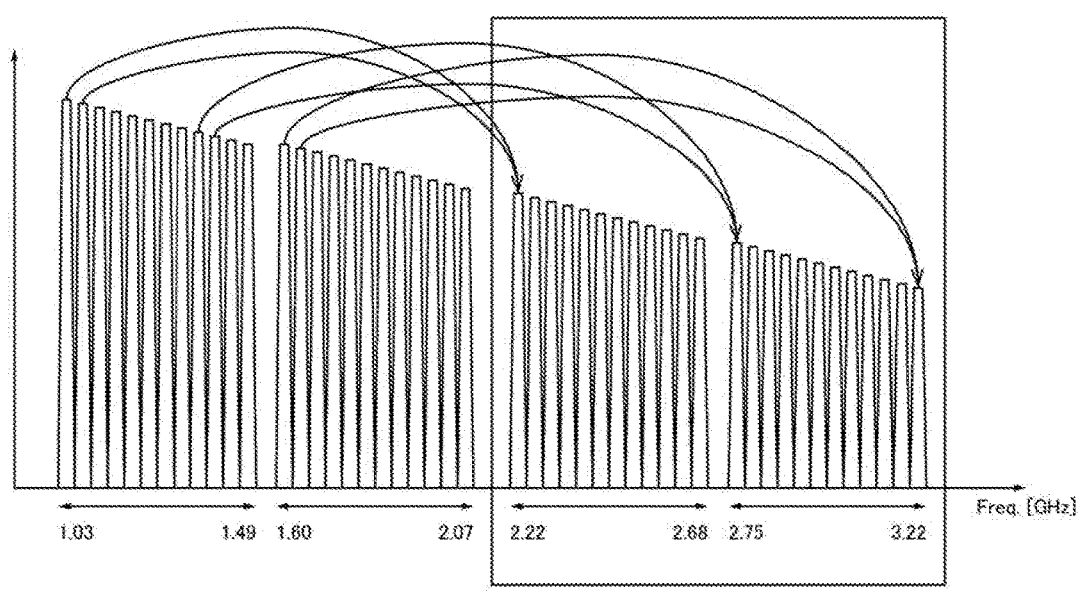
FIG. 14 is a diagram illustrating interference between an existing frequency domain and a newly added frequency domain in accordance with the present technology.

As depicted in FIG. 14, a twofold distortion occurs due to IFs of adjacent channels included in an existing band. In FIG. 14, the band (1.03 GHz to 1.49 GHz) represents a band of channels No. BS-1 to BS-23, and the band (1.6 GHz to 2.07 GHz) represents a band of channels No. ND-2 to ND-24. Further, the band (2.22 GHz to 2.68 GHz) represents a band of channels No. BS-2 to BS-24, and the band (2.75 GHz to 3.22 GHz) represents a band of channels No. ND-1 to ND-23. As indicated by the arrows, a twofold-distortion band generated by the IFs of adjacent channels included in the existing band overlaps an extended band to cause an increased distortion. As an example, a second-order distortion, such as (1500 MHz+1600 MHz=3100 MHz) (1350 MHz+1450 MHz=2800 MHz), occurs. Furthermore, a distortion of a frequency difference between IFs of adjacent channels in the extended band occurs. This causes a problem in which this distortion affects the IF of the existing band. The present technology is able to prevent the occurrence of such distortion.

Moreover, the newly added frequency domain of advanced BS broadcasts overlaps with a frequency domain of equipment used in daily life such as Wi-Fi (registered trademark) devices and microwave ovens. Therefore, higher-performance shielding properties are required than in the case of a tuner device in the past. In particular, new standards are introduced for unwanted radiation from tuners, and more stringent regulations will be certainly introduced. The present technology adopts a configuration that suppresses unwanted radiation in the newly added frequency domain.

2. First Embodiment of Present Technology

Figure 1:
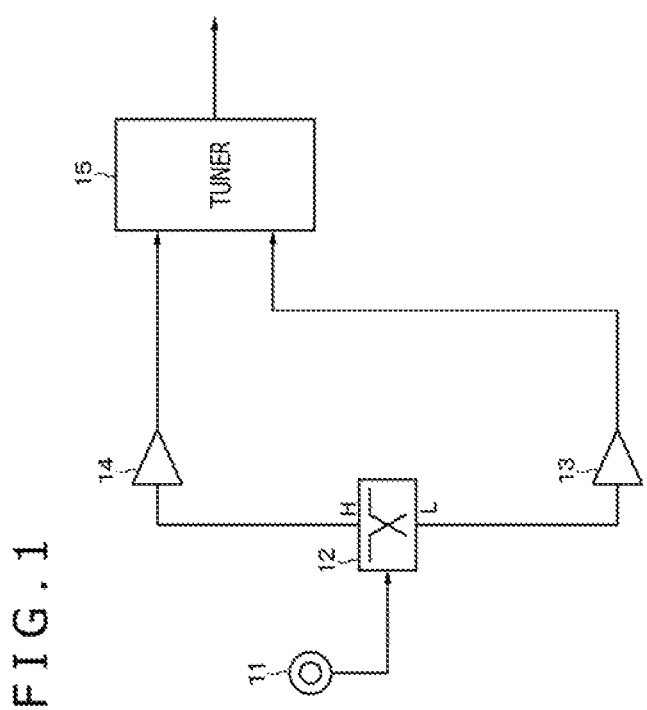
FIG. 1 is a block diagram illustrating a first embodiment of the present technology.

A first embodiment of the present technology will now be described with reference to FIG. 1. An IF signal is supplied from an RF signal input terminal 11. Although not depicted, an IF is formed by frequency conversion in a converter received by a BS reception antenna. The IF is supplied to the RF signal input terminal 11 via a coaxial cable used as a connection cable.

The RF signal input terminal 11 is, for example, a coaxial connector such as an F-type connector. One type of F-type connector is connected to one end of a coaxial cable and is called, for example, an F-type connector plug. Another type is an F-type connector that receives a center conductor (hereinafter referred to as a core wire) of a coaxial cable protruding from an F-type connector plug, and is called, for example, an F-type connector receptacle. The RF signal input terminal 11 is an F-type connector receptacle. However, the RF signal input terminal 11 may be an element other than an F-type connector, such as an IEC (International Electrotechnical Commission) connector.

The IF from the RF signal input terminal 11 is supplied to a diplexer 12. The diplexer 12 separates an input IF into first and second signals in different bands. As depicted in FIG. 14, the band of the first signal is a band (e.g., 0.95 GHz to 2.15 GHz) including existing BS broadcast IF bands ((1.03 GHz to 1.49 GHz) and (1.6 GHz to 2.07 GHz)) (hereinafter referred to as an existing frequency domain (an output on a side marked "L") as appropriate). The band of the second signal is a band (e.g., 2.15 GHz to 3.2 GHz) including (2.22 GHz to 2.68 GHz) and (2.75 GHz to 3.22 GHz) (hereinafter referred to as a newly added frequency domain (an output on a side marked "H") as appropriate).

The first signal in the existing frequency domain, which is separated by a diplexer 2 is amplified by a first amplifier, such as an LNA (Low Noise Amplifier) 13, and supplied to an input on the existing frequency domain side of a tuner 15 for receiving existing BS broadcasts and advanced BS broadcasts. The second signal in the newly added frequency domain, which is separated by the diplexer 2, is amplified by a second amplifier, such as an LNA 14, and supplied to an input on the newly added frequency domain side of the tuner 15 for receiving existing BS broadcasts and advanced BS broadcasts.

The tuner 15 performs signal processing on each of the existing frequency domain and the newly added frequency domain. A signal processing section (not depicted) for performing processing, such as decoding, on the output of the tuner 15 is connected in order to eventually obtain a TS (Transport Stream). The diplexer 12, the LNA 13, and the LNA 14 form an RF input side circuit with respect to the tuner 15. The configuration including the RF input side circuit and the tuner 15 is referred to as a tuner device. Alternatively, the tuner 15 may be configured so as to allow a later-described diplexer for acquiring an RF signal output to frequency-multiplex the first and second signals to obtain a signal and perform processing on the obtained signal. Another alternative is to configure the tuner 15 as a tuner capable of receiving digital terrestrial broadcasts. The above-mentioned configurations of the tuner 15 are similar to the configurations of the tuner 15 in later-described other embodiments. However, for the sake of simplicity, the following description deals with a BS broadcast tuner.

According to the first embodiment, which has been described above, the diplexer 12 frequency-separates an input RF signal band into the existing frequency domain and the newly added frequency domain so that the signals in the respective domains are supplied to the LNA 13 and the LNA 14. This prevents a twofold distortion generated in the LNA 13 from mixing with the newly added frequency domain extracted at the output of the LNA 14. Meanwhile, a low-frequency distortion generated in the LNA 14 is prevented from mixing with the existing frequency domain extracted at the output of the LNA 13. Therefore, the tuner 15 is allowed to process a low-distortion IF. This improves the quality of a received signal.

3. Second Embodiment of Present Technology

Figure 2:
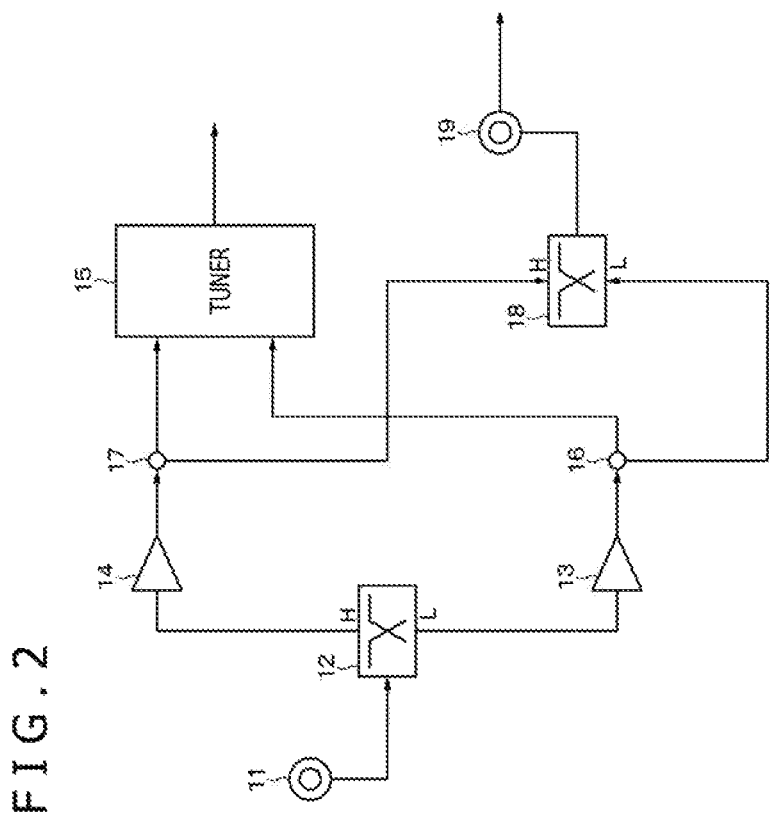
FIG. 2 is a block diagram illustrating a second embodiment of the present technology.

A second embodiment of the present technology will now be described with reference to FIG. 2. The second embodiment is applied, for example, to a Blu-ray disc (registered trademark) recorder (hereinafter simply referred to as a recorder), a hard disk recorder, or an STB (Set-Top box). An IF from the RF signal input terminal 11 is supplied to the diplexer 12 and frequency-separated into the existing frequency domain and the newly added frequency domain. Then, the first signal in the existing frequency domain is supplied to the LNA 13, and the second signal in the newly added frequency domain is supplied to the LNA 14.

Distributers 16 and 17 are connected to the respective outputs of the LNA 13 and LNA 14. The distributor 16 branches the output signal of the LNA 13 into two signals, one of which is supplied to the existing frequency domain side input of the tuner 15, and the other of which (the third signal) is supplied to one input terminal of a diplexer 18. Further, the distributor 17 branches the output signal of the LNA 14 into two signals, one of which is supplied to the newly added frequency domain side input of the tuner 15, and the other of which (the fourth signal) is supplied to the other input terminal of the diplexer 18.

The diplexer 18 frequency-separates the existing frequency domain of the third signal received from the distributor 16, frequency-separates the newly added frequency domain of the fourth signal received from the distributor 17, frequency-multiplexes the resulting separated signals, and outputs the frequency-multiplexed signal to an RF signal output terminal 19. The RF signal output terminal 19 is, for example, an F-type connector receptacle. An IF extracted at the output of the RF signal output terminal 19 is supplied to a tuner of a television receiver. The diplexer 12, the LNAs 13 and 14, the distributors 16 and 17, and the diplexer 18 form the RF input side circuit.

Figure 3:
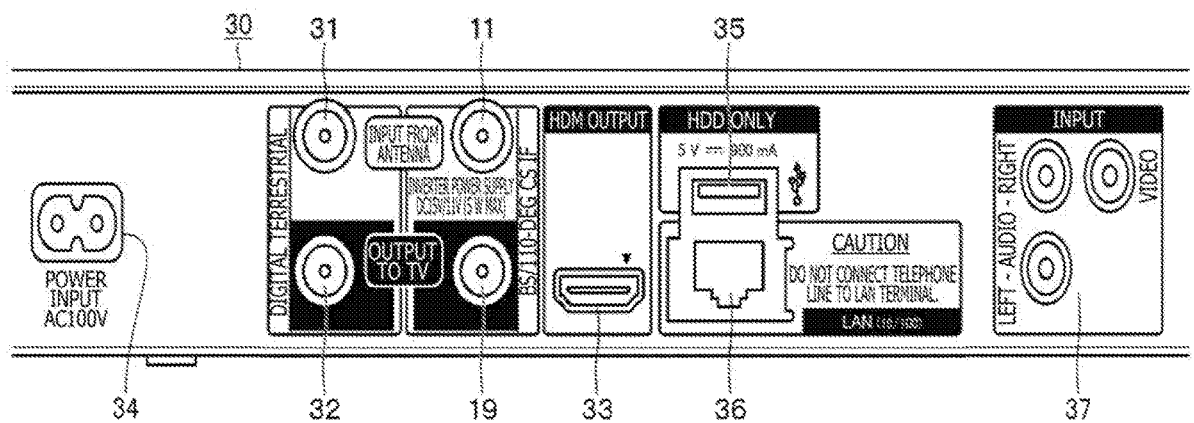
FIG. 3 is a partially enlarged view of an example of a rear panel of a recorder to which the present technology is applicable.

FIG. 3 illustrates an example of a rear panel of a recorder 30. Mounted on the rear panel are the above-described RF signal input terminal 11 and RF signal output terminal 19 for BS broadcasts. Further, an RF signal input terminal 31 and RF signal output terminal 32 for digital terrestrial broadcasts are disposed near the terminals 11 and 19. Additionally, an HDMI (High-definition multimedia interface) (registered trademark) output terminal 33 for digital output, a power input terminal 34, a USB (Universal Serial Bus) terminal 35, a LAN (Local Area Network) terminal 36, and audio/video input terminals 37 are mounted on the rear panel.

Figure 4:
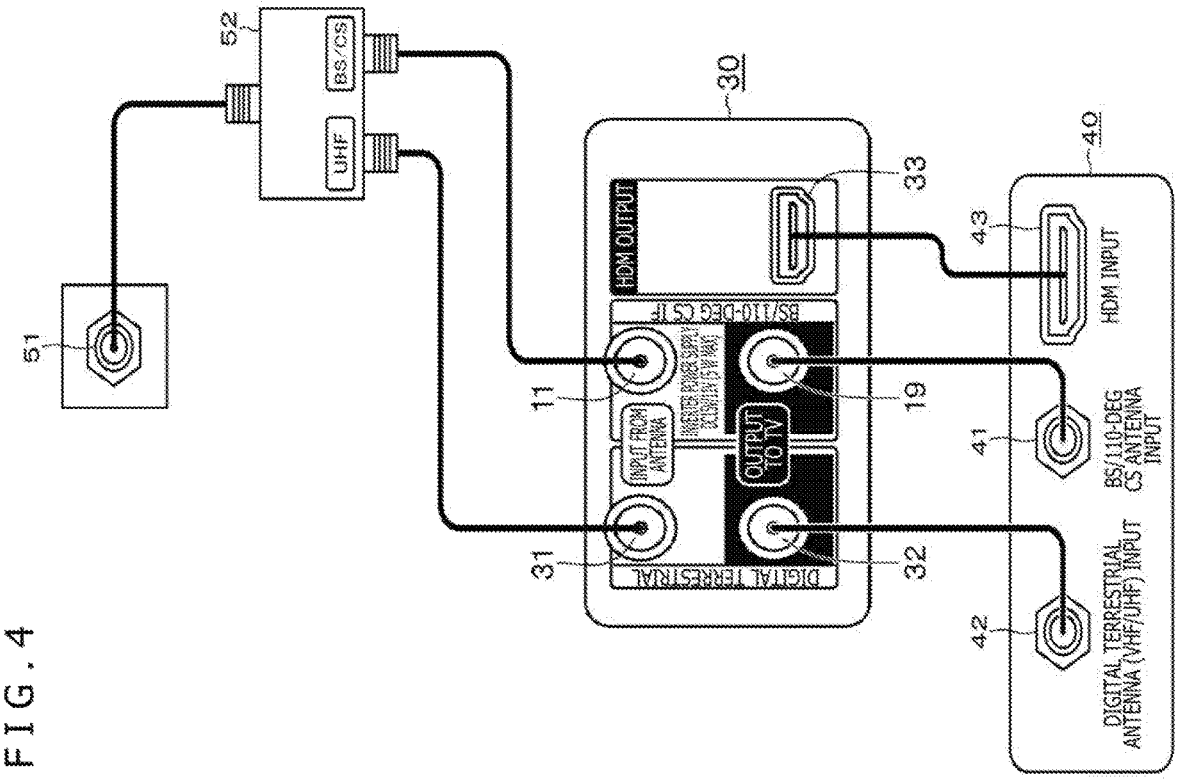
FIG. 4 is a schematic wiring diagram illustrating the connections of the recorder.

As depicted in FIG. 4, an antenna input is supplied to a recorder 40. For example, a BS/110-degree CS broadcast IF and a digital terrestrial broadcast IF are mixed together and directed to a television terminal 51 in a room via an antenna cable. A branching filter 52 is connected to the television terminal 51 and used to separate the mixture into a UHF band IF and a BS/CS broadcast IF.

The BS/CS broadcast IF is supplied to the RF signal input terminal 11 of the recorder 30 via an antenna cable, and the UHF band IF is supplied to the RF signal input terminal 31 via an antenna cable. The RF signal output terminal 19 of the recorder 30 is connected to a BS/CS broadcast antenna input terminal 41 of the television receiver via an antenna cable. The RF signal output terminal 32 of the recorder 30 is connected to a digital terrestrial broadcast antenna input terminal 42 of the television receiver via an antenna cable. Further, the HDMI (registered trademark) output terminal 33 is connected to an HDMI (registered trademark) input terminal 43 of the television receiver via an HDMI (registered trademark) cable.

When the above-described connections are made, it is possible to view BS/110-degree CS broadcasts and digital terrestrial broadcasts from the television receiver 40, and use the recorder 30 to record a received broadcast program on a hard disk. Further, in a case where the recorder 30 and the television receiver 40 are configured to support advanced BS broadcasts, it is possible to view advanced BS broadcasts (4K/8K broadcasts). It should be noted that the configuration of the recorder 30 depicted in FIGS. 3 and 4 is an example configuration, and that the connections depicted in FIG. 4 are example connections.

As is the case with the first embodiment, the second embodiment, which has been described above, is able to reduce the distortion of the IF supplied to the tuner 15. Further, the second embodiment is able to enable the diplexer 18 to remove the distortion of the IF extracted at the RF signal output terminal 19. As the newly added frequency domain of advanced BS broadcasts overlaps with the frequencies of equipment used in daily life such as Wi-Fi (registered trademark) devices and microwave ovens, higher-performance shielding properties are required than in the case of a tuner in the past. In particular, new standards are introduced for radiation from tuners, and more stringent regulations will be certainly introduced.

4. Third Embodiment of Present Technology

Figure 5:
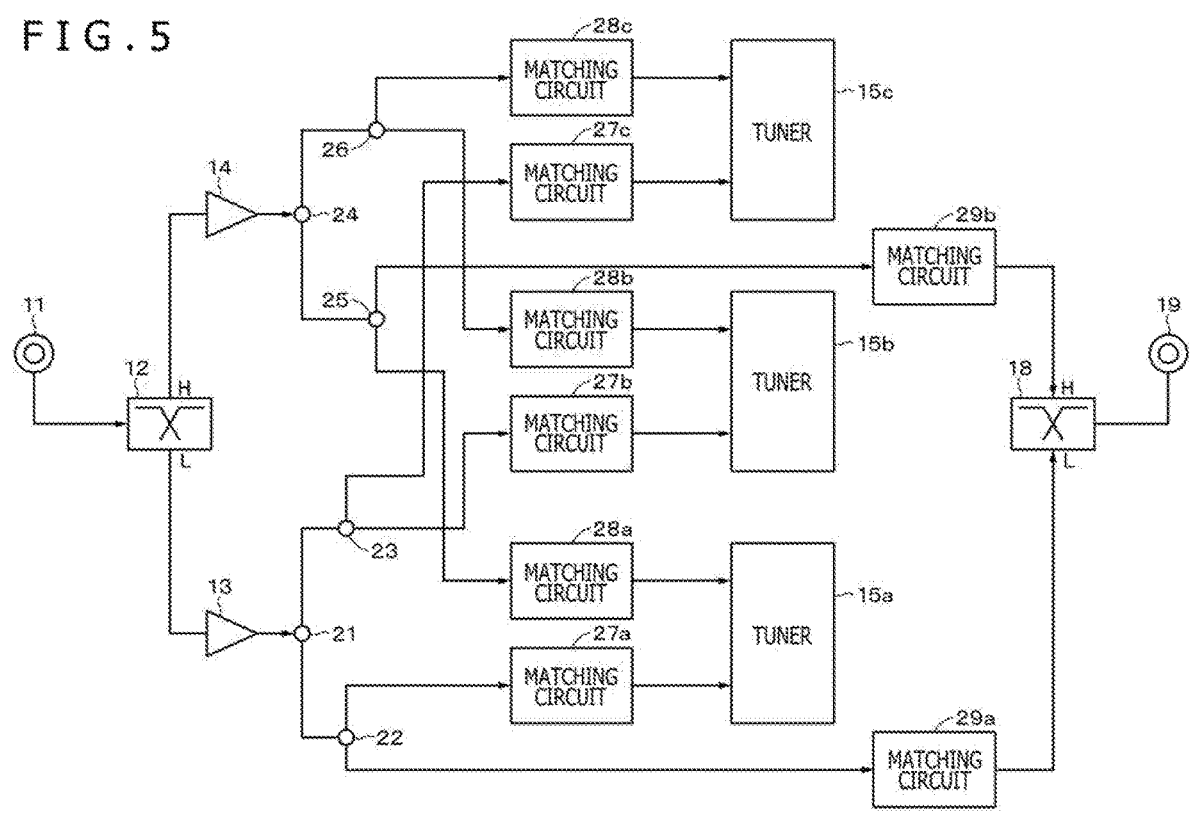
FIG. 5 is a block diagram illustrating a third embodiment of the present technology.

A third embodiment of the present technology will now be described with reference to FIG. 5. As is the case with the second embodiment, the third embodiment is applied to a recorder or an STB. Further, the third embodiment includes three tuners 15a, 15b, and 15c. When two or more tuners are included, it is possible to simultaneously record two or more programs.

The IF from the RF signal input terminal 11 is supplied to the diplexer 12 and frequency-separated into the first signal in the existing frequency domain and the second signal in the newly added frequency domain. Then, the first signal in the existing frequency domain is supplied to the LNA 13, and the second signal in the newly added frequency domain is supplied to the LNA 14. A distributor 21 is connected to the output of the LNA 13, and distributors 22 and 23 are connected to the output of the distributor 21. A distributor 24 is connected to the output of the LNA 14, and distributors 25 and 26 are connected to the output of the distributor 24.

The output signal of the LNA 13 is branched into two signals by the distributor 21, and each of the branched-off signals is further branched into two signals by the distributors 22 and 23. One output signal of the distributor 22 (the third signal) is supplied to the existing frequency domain side input of the diplexer 18 through a matching circuit 29a. The other output signal of the distributor 22 is supplied to the existing frequency domain side input of the tuner 15a through a matching circuit 27a. One output signal of the distributor 23 is supplied to the existing frequency domain side input of the tuner 15b through a matching circuit 27b, and the other output signal of the distributor 23 is supplied to the existing frequency domain side input of the tuner 15c through a matching circuit 27c.

The output signal of the LNA 14 is branched into two signals by the distributor 24, and each of the branched-off signals is further branched into two signals by the distributors 25 and 26. One output signal of the distributor 25 (the fourth signal) is supplied to the newly added frequency domain side input of the diplexer 18 through a matching circuit 29b. The other output signal of the distributor 25 is supplied to the newly added frequency domain side input of the tuner 15a through a matching circuit 28a. One output signal of the distributor 26 is supplied to the newly added frequency domain side input of the tuner 15b through a matching circuit 28b, and the other output signal of the distributor 26 is supplied to the newly added frequency domain side input of the tuner 15c through a matching circuit 28c.

The diplexer 18 frequency-separates the existing frequency domain in the output signal of the matching circuit 29a, frequency-separates the newly added frequency domain in the output signal of the matching circuit 29b, frequency-multiplexes the resulting separated signals, and outputs the frequency-multiplexed signal to the RF signal output terminal 19. The RF signal output terminal 19 is, for example, an F-type connector receptacle. An IF extracted at the output of the RF signal output terminal 19 is supplied to the tuner of the television receiver.

As described with reference to FIGS. 3 and 4, the third embodiment is applicable to a BS broadcast or an advanced BS broadcast tuner of a recorder. As is the case with the first and second embodiments, the third embodiment, which has been described above, is able to reduce the distortion of the IF supplied to the tuners 15a, 15b, and 15c. Further, the third embodiment is also able to enable the diplexer 18 to remove the distortion of the IF extracted at the RF signal output terminal 19.

Moreover, the third embodiment is configured such that the matching circuits 27a, 27b, and 27c are disposed on the existing frequency domain side of the tuners 15a, 15b, and 15c, and that the matching circuits 28a, 28b, and 28c are disposed on the newly added frequency domain side of the tuners 15a, 15b, and 15c. Therefore, even in a case where the number of tuners is decreased (e.g., the tuners 15b and 15c are removed to leave only the tuner 15a), the equipment connected to the RF signal output terminal 19 varies, or an impedance change occurs due to a status change in the input sections of the tuners 15a, 15b, and 15c, the above-mentioned matching circuits are able to achieve impedance matching. This ensures that the other connected terminals or circuits remain unaffected.

5. Fourth Embodiment of Present Technology

Figure 6:
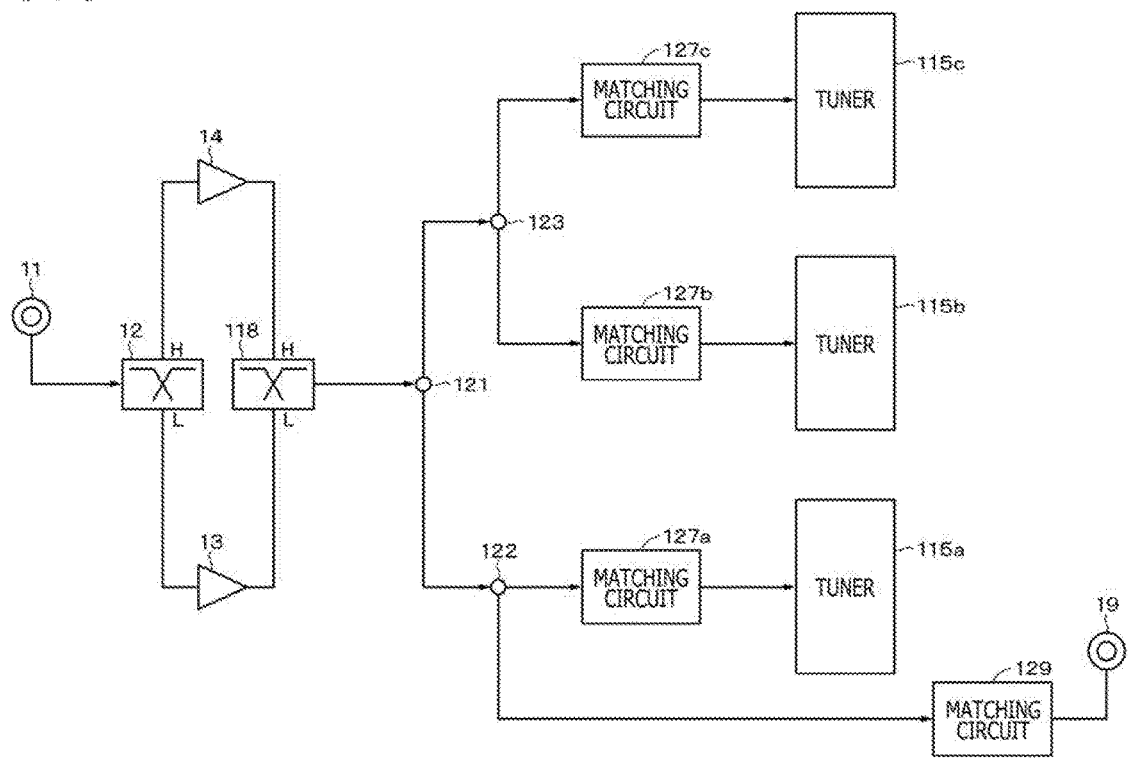
FIG. 6 is a block diagram illustrating a fourth embodiment of the present technology.

A fourth embodiment of the present technology will now be described with reference to FIG. 6. As is the case with the third embodiment, the fourth embodiment is applied to a recorder or an STB. Further, the fourth embodiment includes three tuners 115a, 115b, and 115c. Inputs of the tuners 115a, 115b, and 115c are not separated into an existing frequency domain side input and a newly added frequency domain side input.

The IF from the RF signal input terminal 11 is supplied to the diplexer 12 and separated into the first signal in the existing frequency domain and the second signal in the newly added frequency domain. Then, the first signal in the existing frequency domain is supplied to the LNA 13, and the second signal in the newly added frequency domain is supplied to the LNA 14. The output of the LNA 13 and the output of the LNA 14 are supplied to a diplexer 118. The diplexer 118 frequency-separates a fifth signal in the existing frequency domain of the output of the LNA 13, frequency-separates a sixth signal in the newly added frequency domain of the output of the LNA 14, frequency-multiplexes the separated fifth signal and sixth signal, and outputs the frequency-multiplexed signal to a distributor 121. Therefore, an out-of-band distortion, such as a second-order distortion, is removed from the signal outputted from the diplexer 118.

The output of the distributor 121 is supplied to distributors 122 and 123. One of two outputs branched off by the distributor 122 is supplied to a matching circuit 127a, and the other output is supplied to a matching circuit 129. The RF signal output terminal 19 is connected to the matching circuit 129. The RF signal output terminal 19 is, for example, an F-type connector receptacle. An IF extracted at the output of the RF signal output terminal 19 is supplied to the tuner of the television receiver. The output of the matching circuit 127a is supplied to an IF input terminal of the tuner 115a.

One of two outputs branched off by the distributor 123 is supplied to a matching circuit 127b, and the other output is supplied to a matching circuit 127c. The output of the matching circuit 127b is supplied to an IF input terminal of the tuner 115b, and the output of the matching circuit 127c is supplied to an IF input terminal of the tuner 115c.

As described with reference to FIGS. 3 and 4, the fourth embodiment is applicable to a BS broadcast turner or an advanced BS broadcast tuner of a recorder. As is the case with the first, second, and third embodiments, the fourth embodiment, which has been described above, is able to reduce the distortion of the IF supplied to the tuners 115a, 115b, and 115c. Further, the fourth embodiment is also able to enable the diplexer 118 to remove the distortion of the IF extracted at the RF signal output terminal 19.

Moreover, as is the case with the third embodiment, the fourth embodiment is configured such that the matching circuits 127a, 127b, and 127c are disposed on the input side of the tuners 115a, 115b, and 115c. Therefore, even in a case where the number of tuners is decreased, the equipment connected to the RF signal output terminal 19 varies, or an impedance change occurs due to a status change in the input sections of the tuners 115a, 115b, and 115c, the above-mentioned matching circuits are able to achieve impedance matching. This ensures that the other connected terminals or circuits remain unaffected.

As is the case with the first, second, and third embodiments, the fourth embodiment, which has been described above, is able to reduce the distortion of the IF supplied to the tuners 115a, 115b, and 115c. Further, the fourth embodiment is also able to enable the diplexer 118 to remove the distortion of the IF extracted at the RF signal output terminal 19.

6. Example of Tuner Configuration

Figure 7:
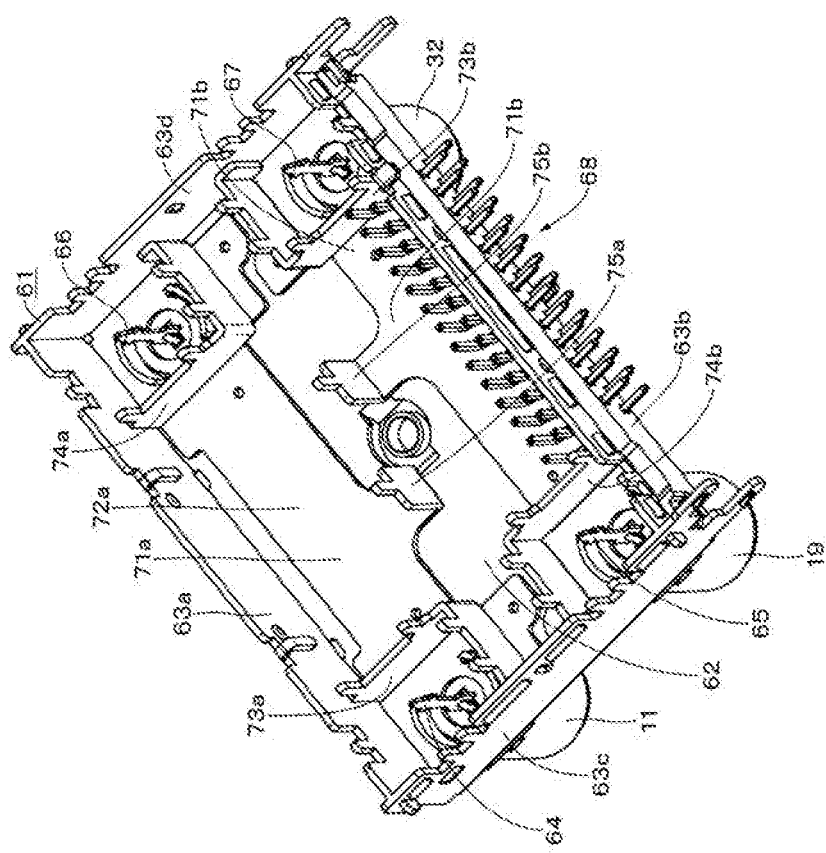
FIG. 7 is a perspective view illustrating an example configuration of a tuner.
Figure 8:
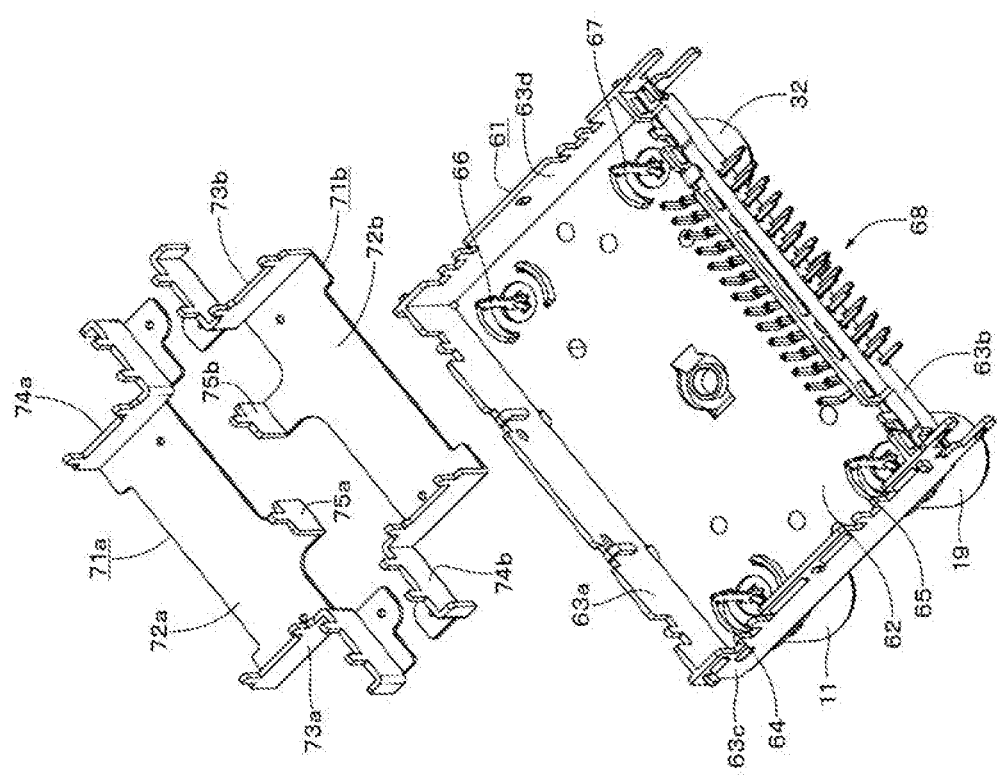
FIG. 8 is a perspective view illustrating an example configuration of the tuner.

The second, third, and fourth embodiments of the present technology, which have been described above, are configured such that connectors and a circuit board with a tuner circuit section mounted thereon are housed in a case, and a cover is installed over a tuner case. An implementation example of a shielded tuner device will now be described with reference to FIGS. 7 and 8. FIG. 7 is a perspective view illustrating a state where the circuit board and the cover are removed. FIG. 8 is a perspective view illustrating a state where the circuit board and brackets are separated. Further, the following description assumes that a tuner housed in the tuner case is able to receive both BS broadcasts and digital terrestrial broadcasts.

Brackets 71a and 71b for shielding are attached to a main surface 62a of the tuner case 61. The tuner case 61 has a rectangular main surface 62 and peripheral members (upper surface plate 63a, bottom surface plate 63b, and side surface plates 63c and 63d). The peripheral members are disposed along the four sides of the main surface 62. The tuner case 61 is a metallic box-like case that functions as a shield case. For example, the width in the height direction (the distance between the upper surface plate 63a and the bottom surface plate 63b) of the main surface 62 of the tuner case 61 is slightly smaller than the width of the rear panel of the recorder 30 depicted in FIG. 3 so that no extra space is created above or below the tuner device within a case of the recorder. It should be noted that the tuner case 61 may be rotated by 90 degrees and attached to a device such as a recorder. In that case, the top-bottom relationship and the left-right relationship are interchanged.

Four coaxial connectors, such as F-type connector receptacles, are attached by using mounting holes near four corners of the main surface 62 of the tuner case 61. More specifically, in correspondence with the foregoing description, the RF signal input terminal 11 and the RF signal output terminal 19 (for BS/CS broadcasts), the RF signal input terminal 31 (not depicted in FIGS. 7 and 8), and the RF signal output terminal 32 (for digital terrestrial broadcasts) are attached to the main surface. The connectors may be attached, for example, by crimping. Outer conductors of the connectors include iron, brass, zinc, or other metal, and are mechanically or electrically connected to the tuner case 61.

Connection pieces 64, 65, 66, and 67 connected to core wires (center conductors) of coaxial cables connected to the respective connectors project into the tuner case 61. These connection pieces 64, 65, 66, and 67 are connected to respective signal feed sections on the circuit board (not depicted). Further, the bottom surface plate 63b has many connection pins 68 for interfacing for transmitting and receiving, for example, data and signals to and from an external circuit. The connection pins 68 are attached to a circuit board, for example, of a recorder or other equipment in which the tuner device is incorporated.

The brackets 71a and 71b are obtained, for example, by bending a metal plate having a shielding effect, and are identical in shape. The reason why the brackets 71a and 71b, which are separate from the tuner case 61, are provided for shielding purposes is that, if the tuner case 61 is formed into a shape for shielding, a gap is generated in the tuner case 61 to impair the shielding effect of the tuner case 61. The brackets 71a and 71b are used for shielding purposes in order to avoid the above problem. The brackets 71a and 71b include coupling sections 72a and 72b, shield sections 73a, 73b, 74a, and 74b, and support walls 75a and 75b. The shield sections 73a, 73b, 74a, and 74b are formed on both ends of each of the coupling sections 72a and 72b. The support walls 75a and 75b are erected substantially vertically from a substantially central portion of the respective coupling sections 72a and 72b. The shield sections 73a, 73b, 74a, and 74b each include first and second plate-like members. One end face of the first plate-like member is joined to one end face of the second plate-like member. The other end faces of the first and second plate-like members are joined to respective inner surfaces of the peripheral members near the corners of the tuner case.

The shield section 73a includes a wall 76a disposed substantially in parallel with the upper surface plate 63a of the tuner case 61, and a wall 76a disposed substantially in parallel with the side surface plate 63c. The shield section 73a is disposed so as to surround the vicinity of a corner where the end faces of the upper surface plate 63a and side surface plate 63c are joined together. Therefore, the periphery of the connection piece 64 is surrounded by the shield section 73a. Further, as the vicinity of the corner is covered with the circuit board and the upper lid of the case, it is possible to shield against electromagnetic waves radiated, for example, from the connection piece 64. Furthermore, the vicinity of a corner (including the connection piece 65) where the end faces of the bottom surface plate 63b and side surface plate 63c are joined together is surrounded by the shield section 74b of the bracket 72b. This makes it possible to shield against electromagnetic waves radiated, for example, from the connection piece 65.

Moreover, the vicinity of a corner (including the connection piece 66) where the end faces of the upper surface plate 63a and side surface plate 63d are joined together is surrounded by the shield section 74a of the bracket 72a. This makes it possible to shield against electromagnetic waves radiated, for example, from the connection piece 66. Additionally, the vicinity of a corner (including the connection piece 67) where the end faces of the bottom surface plate 63b and side surface plate 63d are joined together is surrounded by the shield section 73b of the bracket 72b. This makes it possible to shield against electromagnetic waves radiated, for example, from the connection piece 67.

Tips of the support walls 75a and 75b are connected to a ground terminal of the circuit board (not depicted). This makes it possible to firmly support the circuit board and properly ground the brackets 71a and 71b. It should be noted that it is necessary to shield an area of the connection piece 64, which is connected to the RF signal input terminal 11 for receiving the input of an IF of advanced BS broadcasts, and an area of the connection piece 65, which is connected to the RF signal output terminal 19 for outputting an IF of advanced BS broadcasts. Meanwhile, it is not highly necessary to shield areas of the connection pieces 66, 67, which input and output an IF of digital terrestrial broadcasts. However, if the position for connecting an advanced BS broadcast connector is fixed, an inconvenience arises in a case where, for example, the tuner case is rotated or specifications varying from one manufacturer to another are to be complied with. Accordingly, improved versatility is provided by shielding the positions of all the connectors.

It should be noted that the shapes of the brackets 71a and 71b for shielding are merely examples. The brackets 71a and 71b may be of various other shapes. For example, four separate brackets may be used so as to surround respective four corners.

Figures 9, 10:
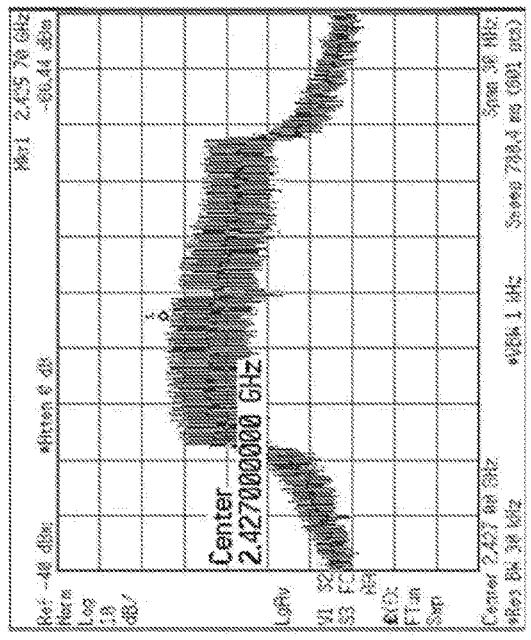
FIG. 9 is a diagram illustrating transmission characteristics of interfering waves with respect to a signal terminal 32 of a model in the past.
FIG. 10 is a diagram illustrating the transmission characteristics of interfering waves with respect to the signal terminal 32 of a model to which a shield structure is added.

The shielding effect of the configuration depicted in FIGS. 7 and 8 indicative of the present technology will now be described with reference to FIGS. 9 and 10. As an example, in a case where an IF signal in a newly added frequency domain with a center frequency of 2.427 GHz and a frequency range of approximately 30 MHz is supplied to the RF signal input terminal 11 and outputted from the RF signal output terminal 19, the level of interfering waves having the above-mentioned frequency is measured at the RF signal output terminal 32 for digital terrestrial broadcasts. FIG. 9 illustrates transmission characteristics of interfering waves with respect to an unshielded tuner device in the past. FIG. 10 illustrates the transmission characteristics of interfering waves with respect to a tuner device that is shielded by the present technology. The results of measurements made as described above indicate that the present technology improves the transmission characteristics by approximately 25 dB and enhances the shielding properties.

Figure 11:
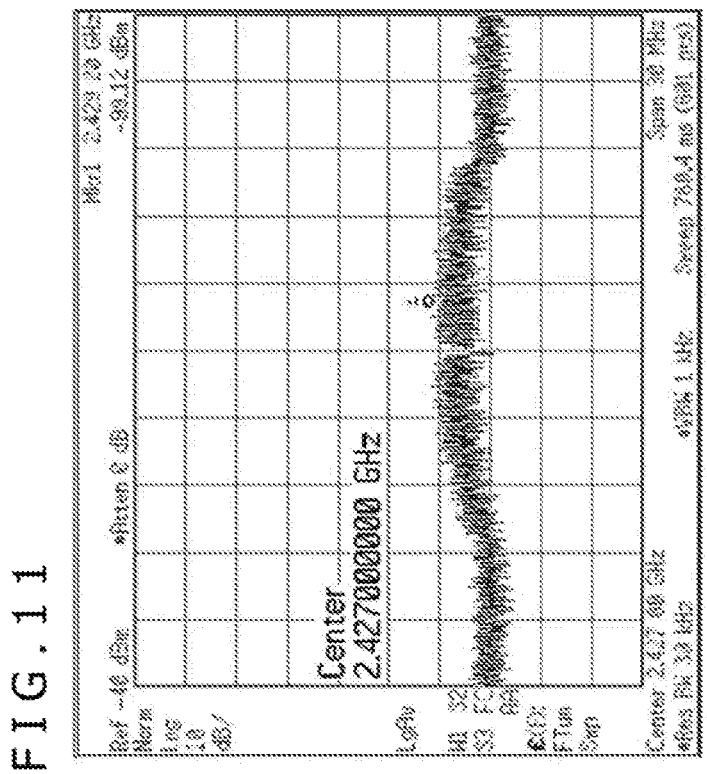
FIG. 11 is a diagram illustrating the transmission characteristics of interfering waves with respect to the signal terminal 32 in a case where a bypass capacitor is additionally attached to a pin connection terminal of the model depicted in FIG. 9.

Further, the configuration for enhancing the shielding effect will now be described. The connection pin 68 depicted in FIGS. 7 and 8 contributes, as an antenna, to the radiation of interfering waves. In order to suppress the influence of the connection pin 68, a small-capacity capacitor that is effective in a frequency band of advanced BS broadcasts and has little influence on each signal line and power supply line is inserted into the connection pin 68 as a bypass capacitor. This measure makes it possible to further improve interference immunity. FIG. 11 illustrates the transmission characteristics of interfering waves in a case where a bypass capacitor is connected. As is obvious from FIG. 11, the transmission characteristics improved by implementing the above-described measure are approximately 33 dB better than the transmission characteristics in the past depicted in FIG. 9.

In a case where a bypass capacitor cannot be provided for the connection pin 68 due to space limitations while the employed configuration is as depicted in FIGS. 7 and 8, it is preferable that connectors in two areas at a distance from the connection pin 68 be set as the RF signal input terminal 11 and RF signal output terminal 19 for BS broadcasts. More specifically, two connectors disposed near a corner (including the connection piece 64) where the end faces of the upper surface plate 63a and side surface plate 63c are joined together and near a corner (including the connection piece 66) where the end faces of the upper surface plate 63a and side surface plate 63d are joined together should preferably be used as the RF signal input terminal and RF signal output terminal for BS broadcasts.

Figure 12:
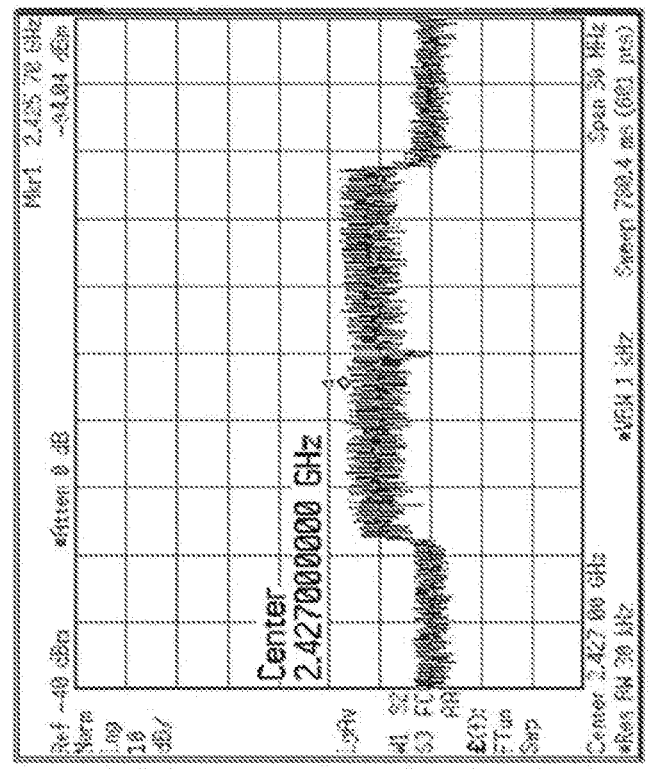
FIG. 12 is a diagram illustrating the transmission characteristics of interfering waves with respect to a signal terminal 11 of the model to which the shield structure is added.

FIG. 12 illustrates the transmission characteristics of interfering waves in a case where connectors disposed at a distance from the connection pin 68 are used. Setting the input terminal 11 as a satellite input/output terminal makes it possible to reduce the influence of a pin terminal 13. FIG. 12 illustrates the transmission characteristics of interfering waves of the connection piece 64. As is obvious from FIG. 12, the transmission characteristics improved in the above-described manner are approximately 28 dB better than the transmission characteristics in the past depicted in FIG. 9.

The first to fourth embodiments and tuner configuration of the present technology, which have been described above, make it possible to minimize reception performance deterioration caused by the difference in signal intensity even in a signal environment where extension is provided up to a newly added frequency domain (2.1 GHz to 3.2 GHz) adapted to advanced BS broadcasts (4K/8K broadcasts), and create a module having excellent reception performance. Further, the first to fourth embodiments and the tuner configuration, which have been described above, make it possible to configure a tuner device that produces an excellent shielding effect against the interference and radiation from various interfering waves generated by an IF in the newly added frequency domain.

Moreover, when connectors are respectively disposed in the corners of the tuner case and properly shielded, it is possible to freely set a connector for handling an IF in the newly added frequency domain of advanced BS broadcasts and form a highly versatile configuration.

7. Modification Examples

While embodiments of the present technology have been described in detail, it should be understood that the present technology is not limited to the foregoing embodiments, and that various modifications can be made based on the technical idea of the present technology. Further, for example, configurations, methods, processes, shapes, materials, and numerical values mentioned in conjunction with the foregoing embodiments can be combined with one another without departing from the spirit of the present technology.

It should be noted that the present technology may adopt the following configurations.

(1)

A tuner device including:

an input terminal that receives an input of a reception signal of satellite digital broadcasts;

a separator that is connected to the input terminal, and adapted to frequency-separate a first signal in a low-frequency domain of the reception signal and a second signal in a high-frequency domain of the reception signal;

a first amplifier and a second amplifier that respectively amplify the first signal and the second signal; and a tuner that receives an input of output signals from the first and second amplifiers.

(2)

The tuner device according to (1), further including:

a multiplexer that frequency-separates a third signal in a low-frequency domain of an output of the first amplifier, frequency-separates a fourth signal in a high-frequency domain of an output of the second amplifier, and frequency-multiplexes the separated third and fourth signals; and an output terminal that is connected to the multiplexer.

(3)

The tuner device according to (1) or (2), in which a matching circuit is disposed on the input side of the tuner.

(4)

The tuner device according to any one of (1) to (3), in which the satellite digital broadcasts include advanced BS broadcasts.

(5)

The tuner device according to any one of (1) to (4), in which the tuner is capable of receiving digital terrestrial broadcasts.

(6)

A tuner device including:

an input terminal that receives an input of a reception signal of satellite digital broadcasts;

a separator that is connected to the input terminal, and adapted to frequency-separate a first signal in a low-frequency domain of the reception signal and a second signal in a high-frequency domain of the reception signal;

a first amplifier and a second amplifier that respectively amplify the first signal and the second signal;

a multiplexer that frequency-separates a fifth signal in a low-frequency domain of an output of the first amplifier, frequency-separates a sixth signal in a high-frequency domain of an output of the second amplifier, and frequency-multiplexes the separated fifth and sixth signals;

a tuner that receives an input of an output signal from the multiplexer; and an output terminal that is connected to the multiplexer.

(7)

The tuner device according to (6) in which a matching circuit is disposed on the input side of the tuner.

(8)

The tuner device according to (6) or (7), in which the satellite digital broadcasts include advanced BS broadcasts.

(9)

The tuner device according to any one of (6) to (8), in which the tuner is capable of receiving digital terrestrial broadcasts.

(10)

A tuner device including:

a tuner case that is metallic and has a substantially rectangular main surface and peripheral members disposed along the periphery of the main surface;

four connectors that are attached to respective areas near four corners of the main surface of the outside of the tuner case; and a shield section that is separated from the tuner case and disposed in each area near the four corners inside the tuner case.

(11)

The tuner device according to (10), in which the shield section includes first and second plate-like members, one end face of the first plate-like member being joined to one end face of the second plate-like member, and the other end faces of the first and second plate-like members are joined to respective inner surfaces of the peripheral members near the corners of the tuner case.

REFERENCE SIGNS LIST

11 . . . RF signal input terminal, 12, 18 . . . Diplexer 13, 14 . . . LNA, 15, 15a, 15b, 15c, 115a, 115b, 115c . . . Tuner, 19 . . . RF signal output terminal, 27a, 27b, 27c . . . Matching circuit, 28a, 28b, 28c . . . Matching circuit, 29a, 29b . . . Matching circuit, 30 . . . Recorder, 31 . . . RF signal input terminal, 32 . . . RF signal output terminal, 40 . . . Television receiver, 61 . . . Tuner case, 64, 65, 66, 67 . . . Connection piece, 68 . . . Connection pin, 71a, 71b . . . Bracket, 73a, 73b . . . Shield section

The invention claimed is:

1. A tuner device comprising:

an input terminal that receives an input of a reception signal of satellite digital broadcasts;

a separator that is connected to the input terminal, and adapted to frequency-separate a first signal in a low-frequency domain of the reception signal and a second signal in a high-frequency domain of the reception signal;

a first amplifier and a second amplifier that respectively amplify the first signal and the second signal; and a tuner that receives an input of output signals from the first and second amplifiers, wherein a twofold-distortion of adjacent channels of the first signal that overlaps with the second signal above 2.22 GHz is prevented.

2. The tuner device according to claim 1, further comprising:

a multiplexer that frequency-separates a third signal in a low-frequency domain of an output of the first amplifier, frequency-separates a fourth signal in a high-frequency domain of an output of the second amplifier, and frequency-multiplexes the separated third and fourth signals; and an output terminal that is connected to the multiplexer.

3. The tuner device according to claim 1, wherein a matching circuit is disposed on the input side of the tuner.

4. The tuner device according to claim 1, wherein the satellite digital broadcasts include advanced BS broadcasts.

5. The tuner device according to claim 1, wherein the tuner is capable of receiving digital terrestrial broadcasts.

6. A tuner device comprising:

an input terminal that receives an input of a reception signal of satellite digital broadcasts;

a separator that is connected to the input terminal, and adapted to frequency-separate a first signal in a low-frequency domain of the reception signal and a second signal in a high-frequency domain of the reception signal;

a first amplifier and a second amplifier that respectively amplify the first signal and the second signal;

a multiplexer that frequency-separates a fifth signal in a low-frequency domain of an output of the first amplifier, frequency-separates a sixth signal in a high-frequency domain of an output of the second amplifier, and frequency-multiplexes the separated fifth and sixth signals;

a tuner that receives an input of an output signal from the multiplexer; and an output terminal that is connected to the multiplexer.

7. The tuner device according to claim 6, wherein a matching circuit is disposed on the input side of the tuner.

8. The tuner device according to claim 6, wherein the satellite digital broadcasts include advanced BS broadcasts.

9. The tuner device according to claim 6, wherein the tuner is capable of receiving digital terrestrial broadcasts.

\* \* \* \* \*